United States Patent
Chang et al.

(10) Patent No.: US 10,790,821 B1
(45) Date of Patent: Sep. 29, 2020

(54) POWER SWITCH CIRCUIT CAPABLE OF REDUCING LEAKAGE CURRENTS

(71) Applicant: eMemory Technology Inc., Hsin-Chu (TW)

(72) Inventors: Chia-Fu Chang, Hsinchu County (TW); Chih-Yang Huang, Hsinchu County (TW)

(73) Assignee: eMemory Technology Inc., Hsin-Chu (TW)

(*) Notice: Subject to any disclaimer, the term of this patent is extended or adjusted under 35 U.S.C. 154(b) by 0 days.

(21) Appl. No.: 16/802,566

(22) Filed: Feb. 27, 2020

Related U.S. Application Data

(60) Provisional application No. 62/832,853, filed on Apr. 11, 2019.

(51) Int. Cl.
| | | |
|---|---|---|
| *H03K 17/00* | (2006.01) | |
| *H03K 17/16* | (2006.01) | |
| *H03K 19/0185* | (2006.01) | |
| *H03K 17/687* | (2006.01) | |
| *H02M 3/07* | (2006.01) | |

(52) U.S. Cl.
CPC ........... *H03K 17/6871* (2013.01); *H02M 3/07* (2013.01)

(58) Field of Classification Search
CPC .............. H03K 17/62; H03K 17/6207; H03K 17/6242; H03K 17/6871; H03K 17/018507; H03K 19/094; H03K 19/09425
See application file for complete search history.

(56) References Cited

U.S. PATENT DOCUMENTS

| | | | |
|---|---|---|---|
| 8,022,574 B2 | 9/2011 | Ryoo | |
| 8,258,853 B2 | 9/2012 | Ku | |
| 10,096,368 B2 * | 10/2018 | Huang | .................... G11C 16/12 |
| 10,693,461 B1 * | 6/2020 | Chang | ............ H03K 19/018528 |

* cited by examiner

Primary Examiner — An T Luu
(74) Attorney, Agent, or Firm — Winston Hsu

(57) ABSTRACT

A voltage selection circuit includes a main selection unit, a first re-comparison unit, and a second re-comparison unit. The main selection unit has a first voltage terminal for receiving a first variable voltage, a second voltage terminal for receiving a second variable voltage, and an output terminal for outputting a greater one of the first variable voltage and the second variable voltage as an operation voltage. The first re-comparison unit adjusts the operation voltage according to a greater one of the operation voltage and the first variable voltage, and the second re-comparison unit adjusts the operation voltage according to a greater one of the operation voltage and the second variable voltage.

14 Claims, 2 Drawing Sheets

POWER SWITCH CIRCUIT CAPABLE OF REDUCING LEAKAGE CURRENTS

CROSS REFERENCE TO RELATED APPLICATIONS

This non-provisional application claims priority of U.S. provisional application No. 62/832,853, filed on Apr. 11, 2019, included herein by reference in its entirety.

BACKGROUND OF THE INVENTION

1. Field of the Invention

The present invention is related to a power switch circuit, and more particularly, to a power switch circuit capable of reducing leakage current.

2. Description of the Prior Art

As the functions of electronic circuits become more and more complicated, the electronic circuits may require different levels of voltages for performing different operations. For example, the non-volatile memory circuit may use the system voltage for reading operation, and use a higher voltage for programming operation. In this case, a power switch circuit will be applied to provide the required voltages on demand.

In the prior art, the power switch circuit is designed to output the highest input voltages. However, the high voltage used for program operation is usually generated by a charge pump, and the charge pump needs some time to pump the voltage to the target level. Therefore, if the input voltages received by the power switch circuit are at similar levels during the voltage pumping process of the charge pump, the power switch circuit would be stocked in an unstable status, producing a significant amount of leakage current.

SUMMARY OF THE INVENTION

One embodiment of the present invention discloses a power switch circuit. The power switch circuit includes an output terminal, a voltage selection circuit, a level shift circuit, and a transistor. The output terminal outputs an output voltage. The voltage selection circuit includes a main selection unit, a first re-comparison unit, and a second re-comparison unit. The main selection unit has a first voltage terminal for receiving a first variable voltage, a second voltage terminal for receiving a second variable voltage, and an output terminal for outputting a greater one of the first variable voltage and the second variable voltage as an operation voltage. The first re-comparison unit adjusts the operation voltage according to a greater one of the operation voltage and the first variable voltage, and the second re-comparison unit adjusts the operation voltage according to a greater one of the operation voltage and the second variable voltage.

The level shift circuit is coupled to the voltage selection circuit, and outputs a control signal according to the first input signal. The transistor has a first terminal for receiving the first variable voltage or the second variable voltage, a second terminal coupled to the output terminal of the power switch circuit, and a control terminal coupled to the level shift circuit for receiving the control signal.

Another embodiment of the present invention discloses a voltage selection circuit. The voltage selection circuit includes a main selection unit, a first re-comparison unit, and a second re-comparison unit.

The main selection unit has a first voltage terminal for receiving a first variable voltage, a second voltage terminal for receiving a second variable voltage, and an output terminal for outputting a greater one of the first variable voltage and the second variable voltage as an operation voltage. The first re-comparison unit adjusts the operation voltage according to a greater one of the operation voltage and the first variable voltage, and the second re-comparison unit adjusts the operation voltage according to a greater one of the operation voltage and the second variable voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
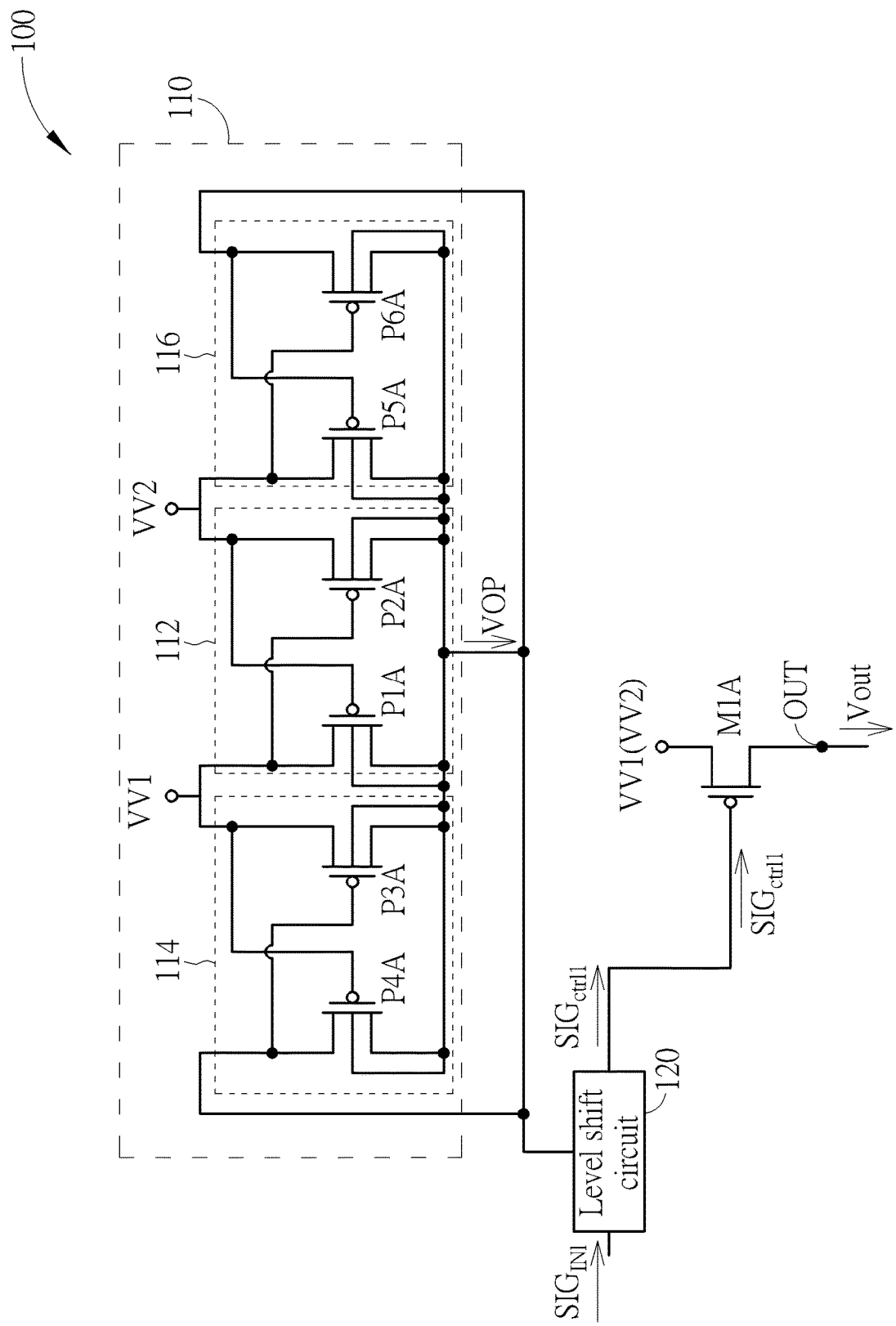
FIG. 1 shows a power switch circuit according to one embodiment of the present invention.

FIG. 1 shows a power switch circuit 100 according to one embodiment of the present invention. The power switch circuit 100 includes an output terminal OUT, a voltage selection circuit 110, a level shift circuit 120, and a transistor M1A.

The voltage selection unit 110 can receive a first variable voltage VV1 and a second variable voltage VV2, and output a greater one of the first variable voltage VV1 and the second variable voltage VV2 as an operation voltage VOP.

The voltage selection circuit 110 includes a main selection unit 112, a first re-comparison unit 114, and a second re-comparison unit 116. The main selection unit 112 has a first voltage terminal for receiving the first variable voltage VV1, a second voltage terminal for receiving the second variable voltage VV2, and an output terminal for outputting a greater one of the first variable voltage VV1 and the second variable voltage VV2 as an operation voltage VOP.

The level shift circuit 120 can be coupled to the voltage selection circuit 110, and can output a control signal $SIG_{ctrl1}$ according to the input signal $SIG_{IN1}$.

In some embodiments, the transistor M1A can be a P-type transistor. The transistor M1A has a first terminal for receiving the first variable voltage VV1, a second terminal coupled to the output terminal OUT of the power switch circuit 100, and a control terminal coupled to the level shift circuit 120 for receiving the control signal $SIG_{ctrl1}$. In this case, the power switch circuit 100 can be used to output the first variable voltage VV1 as the output voltage Vout through the output terminal OUT of the power switch circuit 100 according to the input signal $SIG_{IN1}$.

For example, when the power switch circuit 100 is used to output the first variable voltage VV1 as the output voltage Vout, the input signal $SIG_{IN1}$ would be at a first reference voltage VSS. In some embodiments, the first reference voltage VSS can be the ground voltage of the system. In this case, the level shift circuit 120 will keep the control signal $SIG_{ctrl1}$ to be at the first reference voltage VSS, thereby turning on the transistor M1A for outputting the first variable voltage VV1 as the output voltage Vout. However, when the input signal $SIG_{IN1}$ is at a second reference voltage VDD, the control signal $SIG_{ctrl1}$ would be raised to the operation voltage VOP by the level shift circuit 120, and the level shift circuit 120 will turn off the transistor M1A. Consequently, the power switch circuit 100 will not output the first variable voltage VV1 as the output voltage Vout.

Furthermore, in some embodiments, although the main selection unit 112 is used to output the operation voltage VOP by selecting the greater one of the first variable voltage VV1 and the second variable voltage VV2, the main selection unit 112 may become instable if the first variable voltage VV1 becomes substantially equal to the second variable voltage VV2. For example, the first variable voltage VV1 may be generated by a charge pump while the second variable voltage VV2 can be the same as the second reference voltage VDD already existing in the system. In this case, if the second variable voltage VV2 has reached to a steady level before the charge pump that generates the variable voltage VV1 is enabled, the first variable voltage VV1 may be at a voltage smaller than the second variable voltage VV2. However, after the charge pump is enabled, the first variable voltage VV1 can be increased from being smaller than the second variable voltage VV2 to being greater than the second variable voltage VV2.

In this case, during the transition of the first variable voltage VV1 when the first variable voltage VV1 becomes substantially equal to the second variable voltage VV2, the operation voltage VOP may be lower than the first variable voltage VV1 by a threshold voltage of the transistor P1A. Consequently, the level shift circuit 120 will not be able to raise the control signal $SIG_{ctrl1}$ for turning off the transistor M1A effectively, and the leakage currents will be induced.

To reduce the leakage currents caused by the instable operation voltage VOP, the first re-comparison unit 114 and the second re-comparison unit 116 can be used to adjust the operation voltage VOP. The first re-comparison unit 114 can adjust the operation voltage VOP according to a greater one of the operation voltage VOP and the variable voltage VV1, and the second re-comparison unit 116 can adjust the operation voltage VOP according to a greater one of the operation voltage VOP and the second variable voltage VV2. In this case, whenever the operation voltage VOP is not stable and becomes lower than the first variable voltage VV1 and the second variable voltage VV2, the first re-comparison unit 114 and the second re-comparison unit 116 will adjust the operation voltage VOP to the first variable voltage VV1 or the second variable voltage VV2 so that the transistor M1A can be firmly turned off, reducing the leakage currents.

In FIG. 1, the main selection unit 112 includes P-type transistors P1A and P2A. The P-type transistor P1A has a first terminal coupled to the first voltage terminal of the main selection unit 112, a second terminal coupled to the output terminal of the main selection unit 112, and a control terminal coupled to the second voltage terminal of the main selection unit 112. The P-type transistor P2A has a first terminal coupled to the second voltage terminal of the main selection unit 112, a second terminal coupled to the output terminal of the main selection unit 112, and a control terminal coupled to the first voltage terminal of the main selection unit 112.

In this case, if the first variable voltage VV1 is greater than the second variable voltage VV2, the P-type transistor P1A will be turned on and the P-type transistor P2A will be turned off. Therefore, the main selection unit 112 will output the first variable voltage VV1 as the operation voltage. However, if the first variable voltage VV1 is smaller than the second variable voltage VV2, the P-type transistor P1A will be turned off and the P-type transistor P2A will be turned on. Therefore, the main selection unit 112 will output the second variable voltage VV2 as the operation voltage.

The first re-comparison unit 114 includes P-type transistors P3A and P4A. The P-type transistor P3A has a first terminal coupled to the first voltage terminal of the main selection unit 112, a second terminal coupled to the output terminal of the main selection unit 112, and a control terminal coupled to the output terminal of the main selection unit 112. The P-type transistor P4A has a first terminal coupled to the output terminal of the main selection unit 112, a second terminal coupled to the output terminal of the main selection unit 112, and a control terminal coupled to the first voltage terminal of the main selection unit 112.

In this case, if the operation voltage VOP is smaller than the first variable voltage VV1, the P-type transistor P3A will be turned on and the P-type transistor P4A will be turned off. Consequently, the first re-comparison unit 114 can raise the operation voltage VOP according to the first variable voltage VV1.

Similarly, the second re-comparison unit 116 includes P-type transistors P5A and P6A. The P-type transistor P5A has a first terminal coupled to the second voltage terminal of the main selection unit 112, a second terminal coupled to the output terminal of the main selection unit 112, and a control terminal coupled to the output terminal of the main selection unit 112. The P-type transistor P6A has a first terminal coupled to the output terminal of the main selection unit 112, a second terminal coupled to the output terminal of the main selection unit 112, and a control terminal coupled to the second voltage terminal of the main selection unit 112.

In this case, if the operation voltage VOP is smaller than the second variable voltage VV2, the P-type transistor P5A will be turned on and the P-type transistor P6A will be turned off. Consequently, the second re-comparison unit 116 can raise the operation voltage VOP according to the second variable voltage VV2.

That is, with the re-comparison units 114 and 116, the operation voltage VOP can be maintained at a solid value, and will not be smaller than the first variable voltage VV1 or the second variable voltage VV2 when the first variable voltage VV1 is equal to the second variable voltage VV2. Therefore, the leakage currents caused by instable operation voltage VOP can be reduced.

Furthermore, in some embodiments, the body terminals of the P-type transistors P1A, P2A, P3A, P4A, P5A and P6A can be coupled to the output terminal of the main selection unit 112 for reducing leakage currents. Since the P-type transistors P3A, P4A, P5A and P6A are mainly used to adjust the operation voltage VOP without requiring large current loading, the sizes of the P-type transistors P3A, P4A, P5A and P6A can be rather small.

In present embodiments, the first terminal of the transistor M1A receives the first variable voltage VV1, and the power switch circuit 100 can be used to output the first variable voltage VV1 as the output voltage Vout through the output terminal OUT of the power switch circuit 100. However, in some other embodiments, the first terminal of the transistor M1A may receive the second variable voltage VV2, and the power switch circuit 100 can be used to output the second variable voltage VV2 as the output voltage Vout through the output terminal OUT of the power switch circuit 100. Since the voltage selection circuit 110 is able to stably output the higher voltage of the first variable voltage VV1 and the second variable voltage VV2 as the operation voltage VOP, the leakage current can still be reduced. Furthermore, in some embodiments, the second variable voltage VV2 can also be generated by a charge pump.

Figure 2:
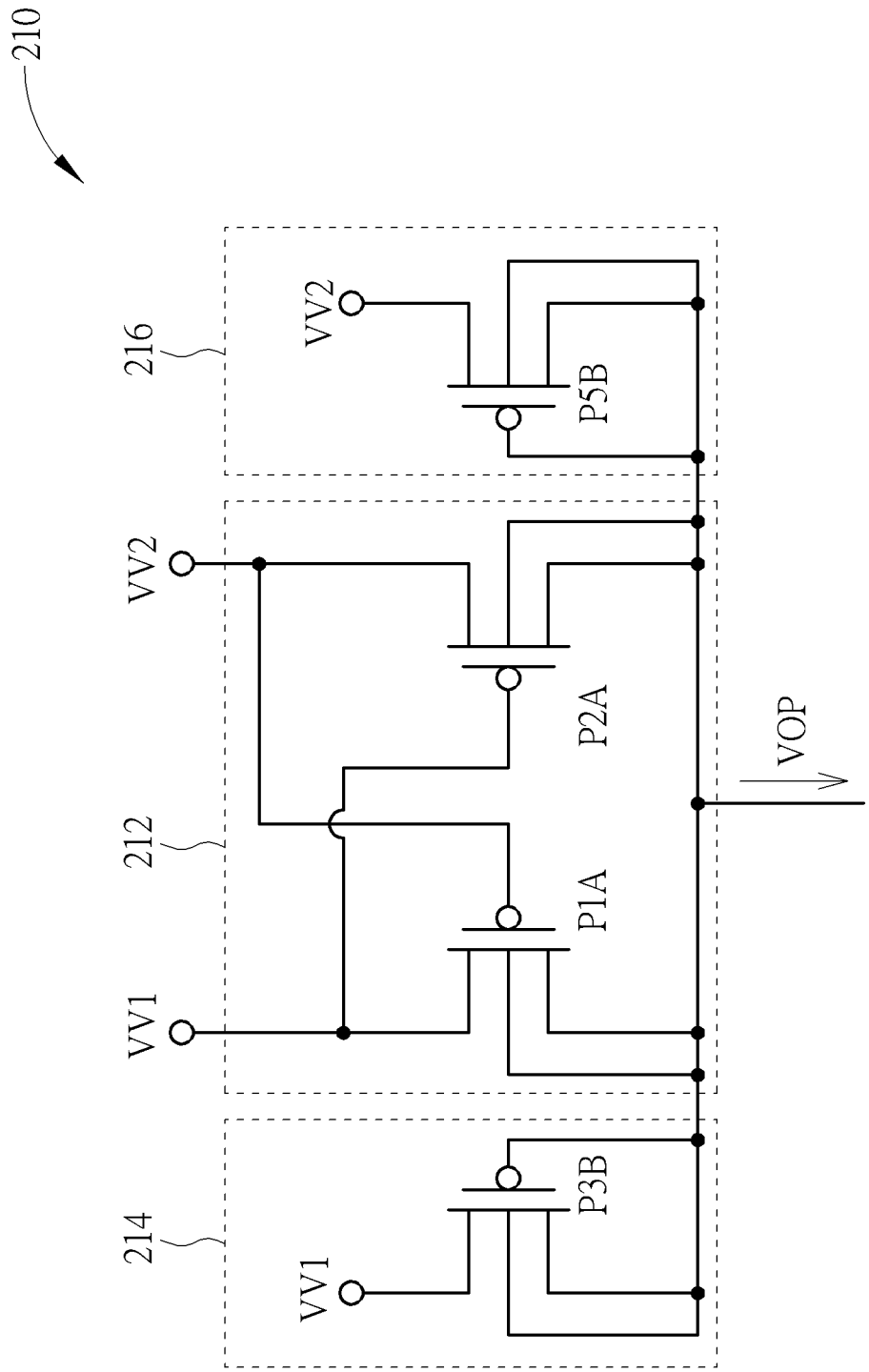
FIG. 2 shows a voltage selection circuit according to another embodiment of the present invention.

FIG. 2 shows a voltage selection circuit 210 according to another embodiment of the present invention. In some embodiments, the voltage selection circuit 210 can be applied to the power switch circuit 100 and replace the voltage selection circuit 110. The voltage selection circuit 210 and the voltage selection circuit 110 have similar structures and can be operated with similar principles. However, each of the re-comparison units 214 and 216 can be implemented by a single P-type transistor.

In FIG. 2, the first re-comparison unit 214 includes a P-type transistor P3B. The P-type transistor P3B has a first terminal coupled to the first voltage terminal of the main selection unit 212 for receiving the first variable voltage VV1, a second terminal coupled to the output terminal of the main selection unit 212, and a control terminal coupled to the output terminal of the main selection unit 212. In this case, if the operation voltage VOP is smaller than the first variable voltage VV1, the P-type transistor P3B will be turned on, and the first re-comparison unit 214 will raise the operation voltage VOP according to the first variable voltage VV1.

Also, the second re-comparison unit 216 includes a P-type transistor P5B. The P-type transistor P5B has a first terminal coupled to the second voltage terminal of the main selection unit 212 for receiving the second variable voltage VV2, a second terminal coupled to the output terminal of the main selection unit 212, and a control terminal coupled to the output terminal of the main selection unit 212. In this case, if the operation voltage VOP is smaller than the second variable voltage VV2, the P-type transistor P5B will be turned on, and the second re-comparison unit 216 will raise the operation voltage VOP according to the second variable voltage VV2.

Since the leakage currents are mostly induced when the first variable voltage VV1 is equal to the second variable voltage VV2 and the operation voltage VOP is smaller than the first variable voltage VV1 and the second variable voltage VV2, the re-comparison units 214 and 216 can adjust the operation voltage VOP with the P-type transistors P3B and P5B without using the P-type transistors P4A and P6A of the re-comparison units 114 and 116 respectively. Therefore, the area of the voltage selection circuit 210 can be even smaller than the area of the voltage selection circuit 110.

In summary, the power switch circuits and the voltage selection circuits provided by the embodiments of the present invention can keep the operation voltage stable by adopting the re-comparison units. Consequently, the leakage currents caused by instable operation voltage can be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power switch circuit comprising:
    an output terminal configured to output an output voltage;
    a voltage selection circuit comprising:
        a main selection unit having a first voltage terminal configured to receive a first variable voltage, a second voltage terminal configured to receive a second variable voltage, and an output terminal configured to output a greater one of the first variable voltage and the second variable voltage as an operation voltage;
        a first re-comparison unit configured to adjust the operation voltage according to a greater one of the operation voltage and the first variable voltage; and
        a second re-comparison unit configured to adjust the operation voltage according to a greater one of the operation voltage and the second variable voltage;
    a level shift circuit coupled to the voltage selection circuit, and configured to output a control signal according to a first input signal; and
    a transistor having a first terminal configured to receive the first variable voltage or the second variable voltage, a second terminal coupled to the output terminal of the power switch circuit, and a control terminal coupled to the level shift circuit for receiving the control signal.

2. The power switch circuit of claim 1, wherein:
    the first variable voltage is generated by a charge pump; and
    after the charge pump is enabled, the first variable voltage is increased from being smaller than the second variable voltage to being greater than the second variable voltage.

3. The power switch circuit of claim 1, wherein the main selection unit comprises:
    a first P-type transistor having a first terminal coupled to the first voltage terminal of the main selection unit, a second terminal coupled to the output terminal of the main selection unit, and a control terminal coupled to the second voltage terminal of the main selection unit; and
    a second P-type transistor having a first terminal coupled to the second voltage terminal of the main selection unit, a second terminal coupled to the output terminal of the main selection unit, and a control terminal coupled to the first voltage terminal of the main selection unit.

4. The power switch circuit of claim 1, wherein the first re-comparison unit comprises:
    a third P-type transistor having a first terminal coupled to the first voltage terminal of the main selection unit, a second terminal coupled to the output terminal of the main selection unit, and a control terminal coupled to the output terminal of the main selection unit.

5. The power switch circuit of claim 4, wherein the first re-comparison unit further comprises:
    a fourth P-type transistor having a first terminal coupled to the output terminal of the main selection unit, a second terminal coupled to the output terminal of the main selection unit, and a control terminal coupled to the first voltage terminal of the main selection unit.

6. The power switch circuit of claim 1, wherein the second re-comparison unit comprises:
    a fifth P-type transistor having a first terminal coupled to the second voltage terminal of the main selection unit, a second terminal coupled to the output terminal of the main selection unit, and a control terminal coupled to the output terminal of the main selection unit.

7. The power switch circuit of claim 6, wherein the second re-comparison unit further comprises:
    a sixth P-type transistor having a first terminal coupled to the output terminal of the main selection unit, a second terminal coupled to the output terminal of the main selection unit, and a control terminal coupled to the first voltage terminal of the main selection unit.

8. A voltage selection circuit comprising:
    a main selection unit having a first voltage terminal configured to receive a first variable voltage, a second voltage terminal configured to receive a second variable voltage, and an output terminal configured to output a greater one of the first variable voltage and the second variable voltage as an operation voltage;

a first re-comparison unit configured to adjust the operation voltage according to a greater one of the operation voltage and the first variable voltage; and a second re-comparison unit configured to adjust the operation voltage according to a greater one of the operation voltage and the second variable voltage.

9. The voltage selection circuit of claim 8, wherein:
the first variable voltage is generated by a charge pump; and
after the charge pump is enabled, the first variable voltage is increased from being smaller than the second variable voltage to being greater than the second variable voltage.

10. The voltage selection circuit of claim 8, wherein the main selection unit comprises:
a first P-type transistor having a first terminal coupled to the first voltage terminal of the main selection unit, a second terminal coupled to the output terminal of the main selection unit, and a control terminal coupled to the second voltage terminal of the main selection unit; and
a second P-type transistor having a first terminal coupled to the second voltage terminal of the main selection unit, a second terminal coupled to the output terminal of the main selection unit, and a control terminal coupled to the first voltage terminal of the main selection unit.

11. The voltage selection circuit of claim 8, wherein the first re-comparison unit comprises:
a third P-type transistor having a first terminal coupled to the first voltage terminal of the main selection unit, a second terminal coupled to the output terminal of the main selection unit, and a control terminal coupled to the output terminal of the main selection unit.

12. The voltage selection circuit of claim 11, wherein the first re-comparison unit further comprises:
a fourth P-type transistor having a first terminal coupled to the output terminal of the main selection unit, a second terminal coupled to the output terminal of the main selection unit, and a control terminal coupled to the first voltage terminal of the main selection unit.

13. The voltage selection circuit of claim 8, wherein the second re-comparison unit comprises:
a fifth P-type transistor having a first terminal coupled to the second voltage terminal of the main selection unit, a second terminal coupled to the output terminal of the main selection unit, and a control terminal coupled to the output terminal of the main selection unit.

14. The voltage selection circuit of claim 13, wherein the second re-comparison unit further comprises:
a sixth P-type transistor having a first terminal coupled to the output terminal of the main selection unit, a second terminal coupled to the output terminal of the main selection unit, and a control terminal coupled to the first voltage terminal of the main selection unit.

* * * * *